United States Patent [19]

Babb et al.

[11] Patent Number: 5,332,306

[45] Date of Patent: Jul. 26, 1994

[54] COMPUTER DISK DRIVE MOUNTING APPARATUS

[75] Inventors: James F. Babb; Roberta M. Madsen, both of Houston, Tex.

[73] Assignee: Compaq Computer Corporation, Houston, Tex.

[21] Appl. No.: 894,117

[22] Filed: Jun. 5, 1992

[51] Int. Cl.[5] .......................... H01R 13/62; H05K 7/16
[52] U.S. Cl. ............................ 312/334.16; 312/223.1;
439/377; 439/354; 361/727; 361/685
[58] Field of Search .................. 29/453; 361/391, 380,
361/395, 685, 727, 724; 312/223.1, 223.2, 333,
334.16, 334.36; 439/377, 354, 357, 358; 211/26,
41

[56] References Cited

U.S. PATENT DOCUMENTS

| | | | |
|---|---|---|---|
| 4,378,137 | 3/1983 | Gibson et al. | 312/108 X |
| 4,960,384 | 10/1990 | Singer et al. | 361/391 X |
| 5,020,926 | 6/1991 | Wilhelm | 361/391 X |
| 5,191,514 | 3/1993 | Kabat et al. | 439/377 X |

*Primary Examiner*—Timothy V. Eley
*Assistant Examiner*—K. V. Nguyen
*Attorney, Agent, or Firm*—Konneker, Bush & Hitt

[57] ABSTRACT

A pair of disk drives are mounted in a compact side-by-side relationship in two adjacent bays of an internal sheet metal computer housing chassis using a snap-in mounting system including two opposing pairs of parallel sheet metal guide channel members snapped into place within specially configured openings in parallel bay walls of the chassis, and pairs of elongated plastic retainer members secured to and longitudinally extending along opposite sides of the disk drives. To quickly mount the disk drives within their chassis bays, each retainer member pair is simply pushed rearwardly into and longitudinally through an associated opposing pair of the guide channel members until the disk drive reaches its operating position within its chassis bay. As the disk drive rearwardly approaches its operating position, leading edge portions of its associated guide channel members inwardly cam opposed front end latch portions on each of the retainer members until bosses thereon snap into notches in the guide channels, thereby releasably locking the disk drive in place. Each disk drive may be quickly removed from the chassis simply by squeezing the opposed latch portions together to remove the bosses from the guide channel member notches, and then pulling the disk drive forwardly out of its drive bay.

12 Claims, 3 Drawing Sheets

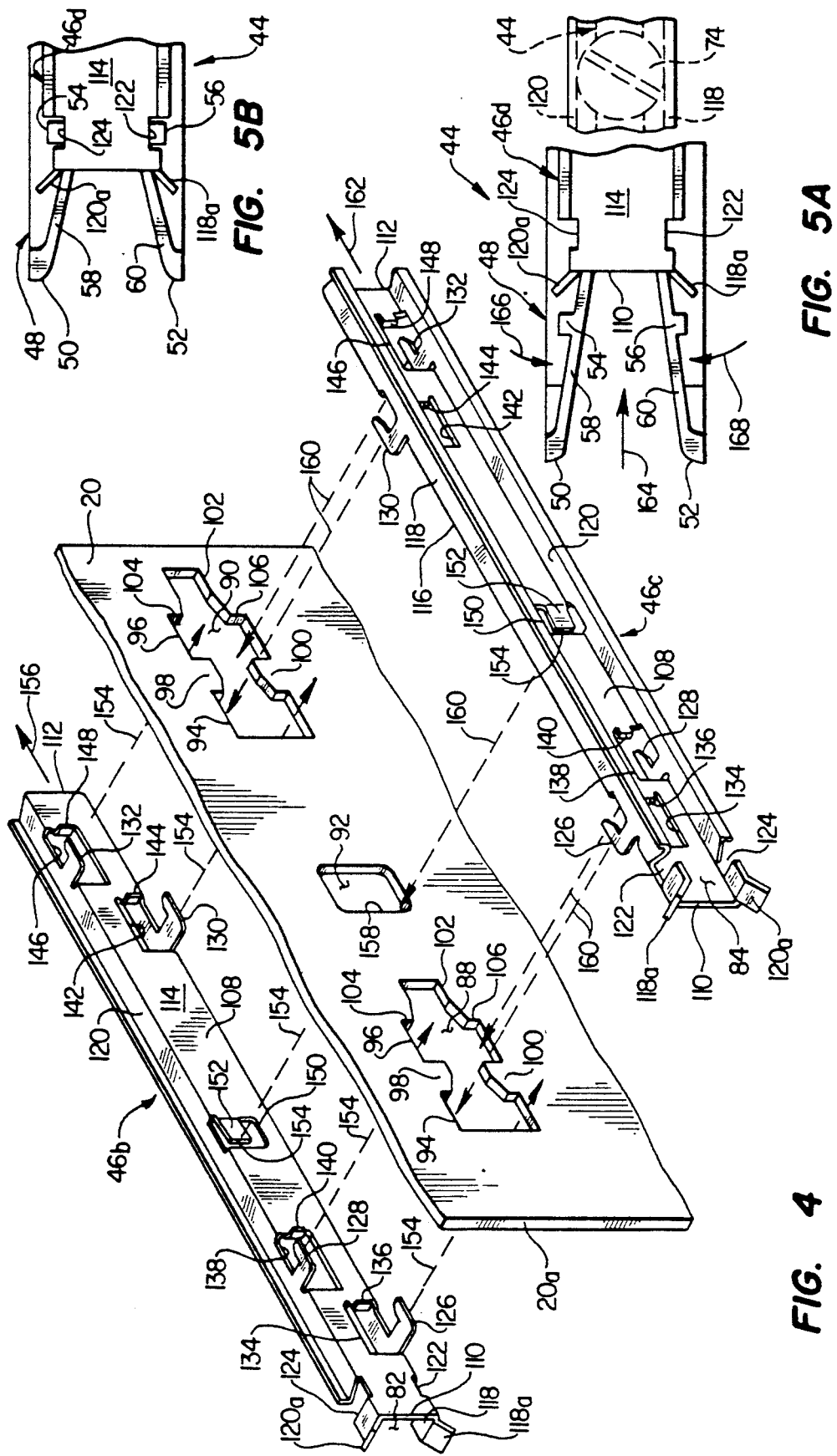

COMPUTER DISK DRIVE MOUNTING APPARATUS

BACKGROUND OF THE INVENTION

1. Field of the Invention

The present invention relates generally to apparatus for mounting operating components within a computer housing, and more particularly relates to apparatus for mounting disk drives on the internal housing chassis portion of a computer.

2. Description of Related Art

Computer disk drives are conventionally secured to sheet metal mounting rail structures which slide into an internal housing chassis compartment along outwardly bent tab sections of parallel, spaced apart interior wall portions of the chassis. The rails are typically provided with outwardly projecting mounting tabs which are screwed into the chassis to hold the installed disk drive in place. To remove the disk drive for service or inspection, these tabs must be unscrewed from the chassis.

As is well known, this can be a rather tedious and laborious task. Additionally, the mounting rails cannot be extended across certain external portions of the drives. Accordingly, these sheet metal rails tend to be relatively thin and flexible, and are rather easily bent. Once the rails become bent, for example during removal of their disk drive from the computer chassis, subsequent alignment and reconnection to the chassis of the removed drive can be quite difficult. Moreover, due to the configuration of conventional sheet metal drive mounting rails and their associated bent-out supporting wall tabs within the chassis interior, difficulties are commonly encountered in attempting to mount disk drives in a compact, side-by-side relationship within a computer chassis.

In view of these difficulties, it is accordingly an object of the present invention to provide improved apparatus and methods for mounting disk drives within a computer chassis.

SUMMARY OF THE INVENTION

In carrying out principles of the present invention, in accordance with a preferred embodiment thereof, apparatus is provided for mounting first and second disk drives in a compact, side-by-side relationship respectively in adjacent first and second bays of a computer chassis. The first and second bays are partially bounded by first, second and third mutually spaced apart parallel chassis walls, with the first bay being disposed between the first and second chassis walls, and the second bay being disposed between the second and third chassis walls.

The mounting apparatus includes first, second third and fourth elongated guide channel members each having a generally U-shaped cross-section along its length, and an open side portion. First means are provided for mounting the four guide channel members on the chassis walls in a parallel, laterally aligned relationship in which (1) the first and second guide channel members are respectively disposed on facing sides of the first and second chassis walls with the open side portions of the first and second guide channel members facing one another, and (2) the third and fourth guide channel members are respectively disposed on facing sides of the second and third chassis walls with the open side portions of the third and fourth guide channel members facing one another.

The first means preferably include spaced series of openings formed in each of the three chassis walls and being bounded by peripheral wall portions, and means associated with the guide channel members and operative to provide a snap-fit mounting engagement between each guide channel member and the peripheral opening wall portions on their associated chassis walls.

The mounting apparatus also includes first, second, third and fourth elongated retainer members configured to be respectively and telescopingly inserted lengthwise through the interiors of the first, second, third and fourth guide channel members, and second means for securing the first and second retainer members, in a longitudinally parallel relationship, to opposite sides of the first disk drive, and for securing the third and fourth retainer members, in a longitudinally parallel relationship, to opposite sides of the second disk drive.

The chassis and guide channel members are representatively formed from sheet metal, the retainer members are preferably of a molded plastic construction, and the second means preferably include metal screws extendable through the retainer members and threadable into the disc drives. The screws have enlarged cylindrical head portions diametrically sized to slidably engage opposite side wall portions of the guide channel members when the retainer members are operatively inserted in the guide channel members. The screws thus conveniently function to electrically ground the mounted disk drives to the chassis through the guide channel members.

The mounting apparatus also includes cooperating means on each of the retainer members and its associated guide channel member for releasably interlocking the guide channel member with its telescopingly received retainer member in response to insertion of the retainer member a predetermined longitudinal distance through the interior of its associated guide channel member. Accordingly, the disk drives may simply be snapped into place on their associated guide channel members instead of having to screw the drives into place on the chassis as required in the prior art.

The cooperating means are preferably defined by (1) resilient, bifurcated front end portions of the retainer members, (2) pairs of projecting bosses positioned on the opposite deflectable arms of the bifurcated portions rearwardly of their outer ends, (3) oppositely sloped front end portions of the opposite side wall sections of each guide channel member, and (4) notches formed in the guide channel member side walls rearwardly adjacent their oppositely sloped front end portions.

As each retainer member approaches full rearward insertion into its associated guide channel member the sloped front side wall portions of the guide channel member inwardly cams the two arm bosses of the retainer member, causing then to slide inwardly along the side wall portions and then snap outwardly into the two side wall notches, thereby releasably interlocking the retainer member and guide channel member. Each mounted disk drive may be subsequently removed by simply squeezing each of its retainer member arm pairs together, to thereby remove the boss pairs from their guide channel member side wall notches, and then pulling the inwardly deflected arm pairs in a forward direction.

BRIEF DESCRIPTION OF THE DRAWINGS

FIG. 4 is an enlarged scale exploded perspective view of a portion of one of the interior chassis walls and a pair of disk drive guide channels mounted in a back-to-back relationship thereon; and FIGS. 5A and 5B are enlarged scale cross-sectional views taken through a front portion of the chassis, generally along line 5—5 of FIG. 2, and sequentially illustrate the manner in which a front end portion of one of the retainer clip members is removably snapped onto a front end portion of its associated guide channel.

DETAILED DESCRIPTION

Figure 1:
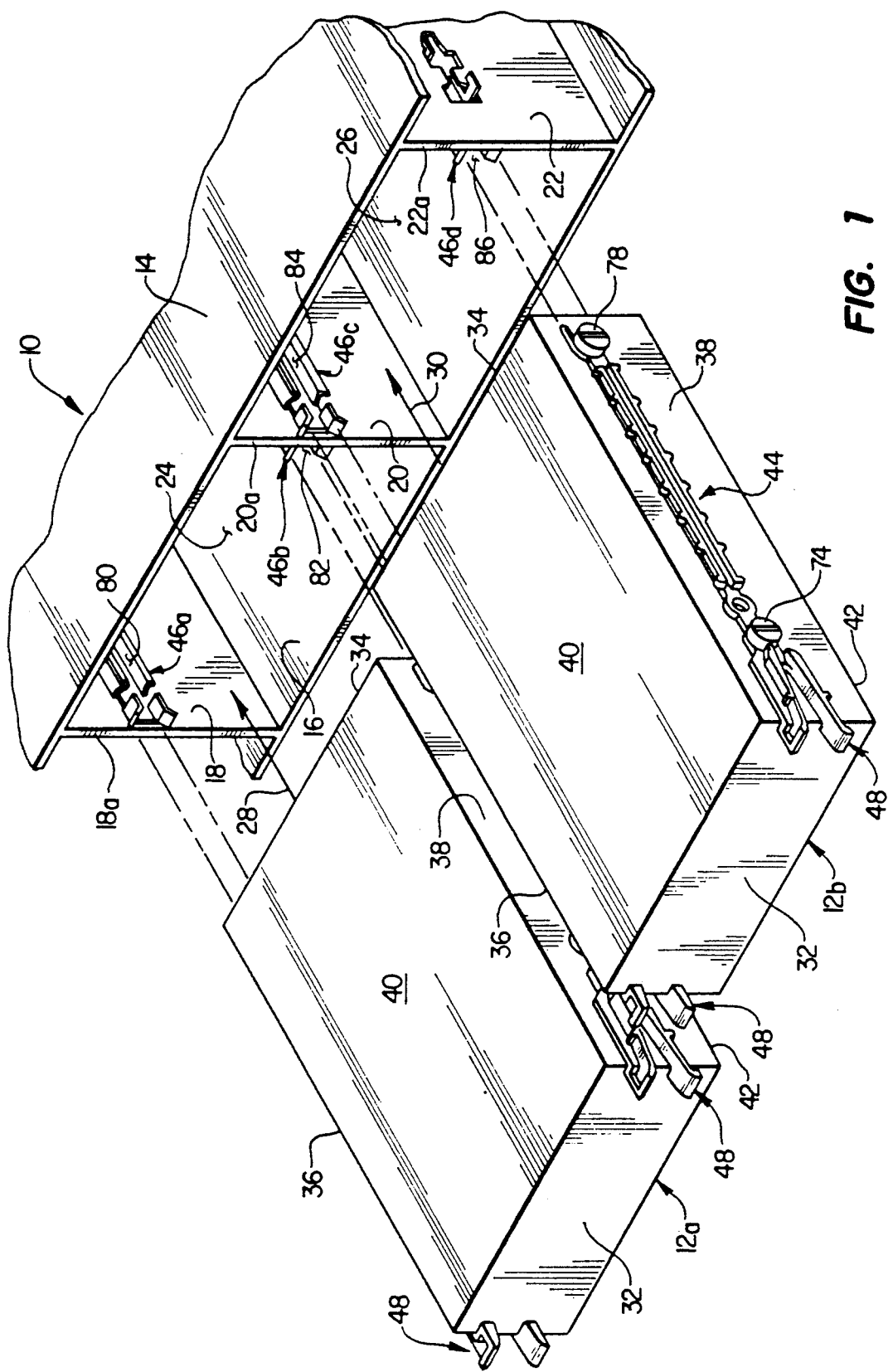
FIG. 1 is an exploded, somewhat simplified perspective view of a portion of an internal computer housing chassis, and a representative pair of disk drives to be supported in the chassis using specially designed snap-in mounting apparatus embodying principles of the present invention.
Figure 2:
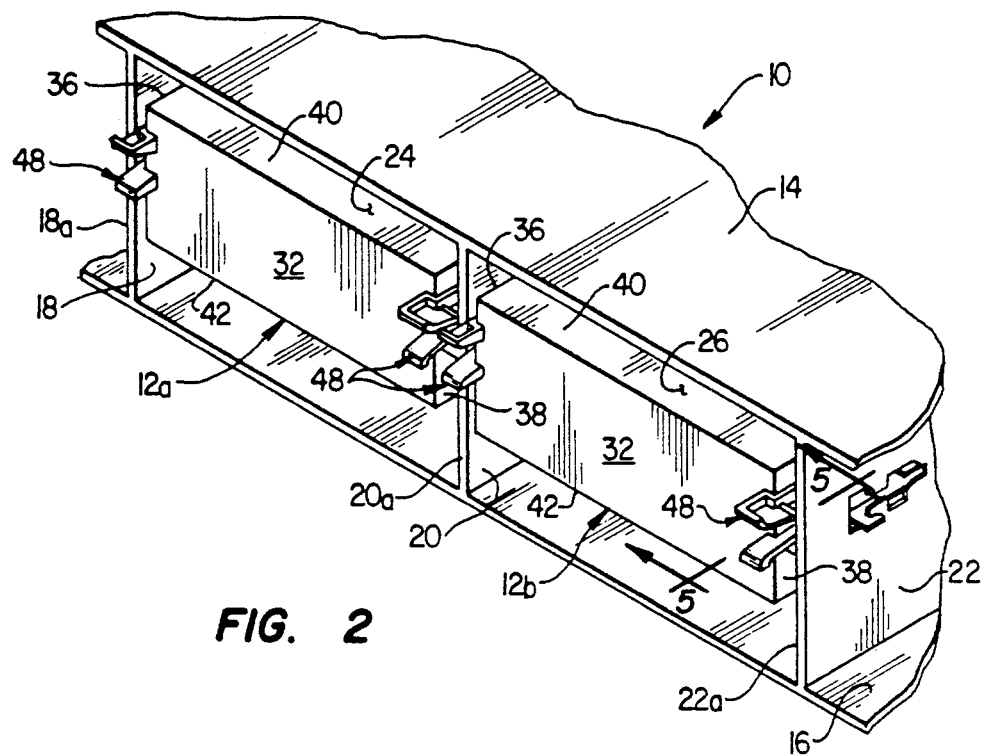
FIG. 2 is a somewhat simplified perspective view showing the disk drives operatively mounted in the chassis in a compact, side-side relationship.

Perspectively illustrated in FIGS. 1 and 2 is an open front side portion of sheet metal chassis 10 positionable within a computer housing (not shown) and used to support various computer operating components such as the illustrated representative pair of disk drives 12a and 12b. Chassis portion 10 includes a vertically spaced, facing pair of horizontal walls 14 and 16 between which three mutually spaced vertical walls 18,20,22 transversely extend, the walls 18,20,22 respectively having front end edges 18a, 20a and 22a.

These five walls define a bay 24 positioned between vertical walls 18,20 and configured to rearwardly receive the disk drive 12a as indicated by the arrow 28 in FIG. 1, and a bay 26 positioned between vertical walls 20,22 and configured to rearwardly receive the disk drive 12b as indicated by the arrow 30 in FIG. 1. The representative disk drives 12a,12b are identical in size and configuration, with each of them having a generally rectangular shape, front and rear ends 32 and 34, left and right sides 36 and 38, and top and bottom sides 40 and 42.

The present invention provides a specially designed snap-lock mounting system operative to releasably latch the disk drives 12a,12b within their associated chassis bays 24,26 in response to rearward insertion of the disk drives through the bays to operating positions in which the disk drives 12a,12b are conveniently positioned in a compact side-by-side relationship within the chassis as depicted in FIG. 2.

Figure 3:
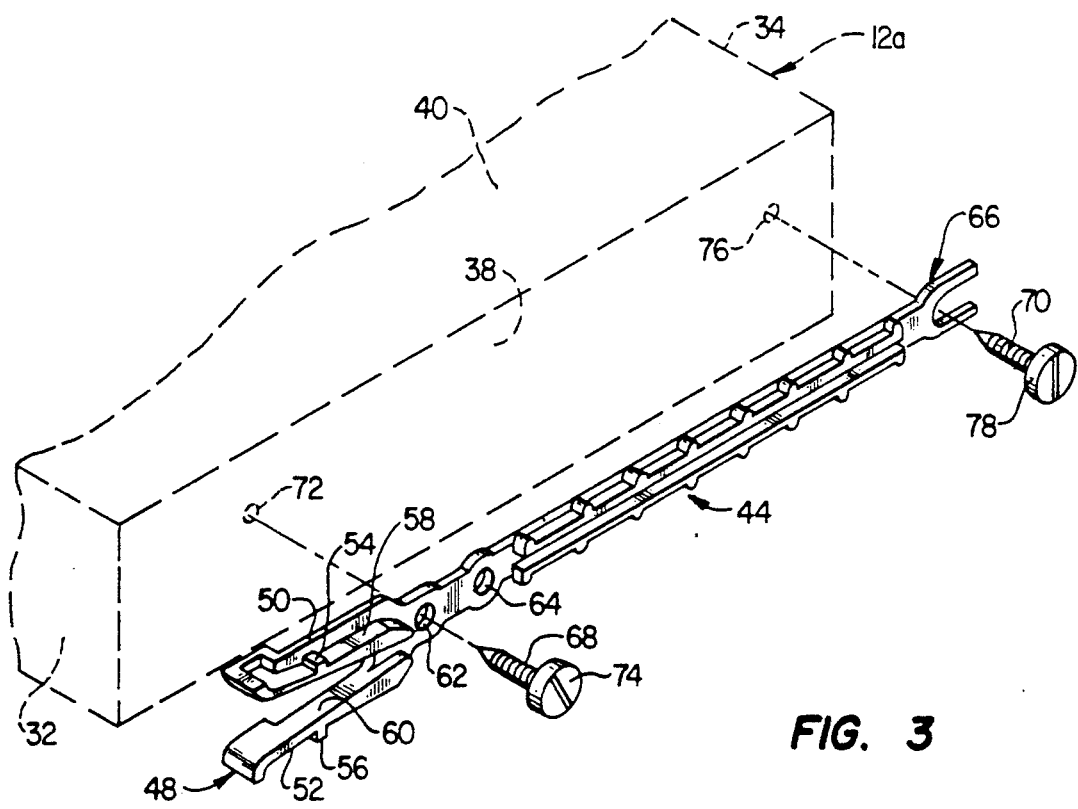
FIG. 3 is an enlarged scale, partially phantomed exploded perspective view of a side portion of one of the disk drives and a retainer clip member secured thereto.

As subsequently described in greater detail, the mounting system includes four identically configured elongated molded plastic retainer members 44 and four identically configured elongated sheet metal guide channel members 46a–46d. With reference now to FIGS. 1 and 3, each of the retainer members 44 has an elongated, generally strip-like configuration and longitudinally extends in a front-to-rear direction along a top portion of one of the opposite side walls 36,38 of the disk drives 12a,12b. FIG. 3 illustrates the retainer strip 44 that extends along the right side wall 38 of the disk drive 12a.

Each of the retainer members 44, as best illustrated in FIG. 3, has a bifurcated front end portion 48 positioned adjacent the front end of its associated disk drive and defined by upper and lower deflectable legs 50 and 52. Rectangular bosses 54,56 respectively project upwardly and downwardly from longitudinally intermediate portions of elongated ledges 58,60 respectively extending along the outer sides of legs 50,52. Immediately to the rear of the legs 50,52 two circular mounting holes 62,64 extending through the retainer member- At the rear end of the retainer is a bifurcated mounting portion 66.

Each of the retainer members 44 is anchored to its associated disk drive side wall 36 or 38 by means of metal screws 68 and 70. Screw 68 extends through retainer member hole 62, is threaded into a mounting hole 72 in the disk drive, and has an enlarged diameter cylindrical head 74. Screw 70 extends through the bifurcated rear end mounting portion 66 of the retainer member, is threaded into a mounting hole 76 in the disk drive, and has an enlarged diameter cylindrical head 78.

Referring now to FIG. 1, the guide channel members 46a,46b have generally U-shaped cross-sections along their lengths, are horizontally secured in a parallel, opposing relationship on facing side surfaces of the vertical chassis walls 18 and 20, and define facing, open-sided tracks 80,82 for longitudinally receiving the retainer members 44 of the disk drive 12a as it is rearwardly inserted into chassis bay 24.

The guide channel members 46c,46d have generally U-shaped cross-sections along their lengths, are horizontally secured in a parallel, opposing relationship on facing side surfaces of the vertical chassis walls 20 and 22, and define facing, open-sided tracks 84,86 for longitudinally receiving the retainer members 44 of the disk drive 12b as it is rearwardly inserted into chassis bay 26. As shown in FIG. 1, the guide channel members 46b,46c are vertically aligned with one another, and are positioned in a back-to-back relationship on the opposite sides of the vertical chassis wall 20. As will be subsequently described, the four guide channel members 46a–46d are installed on the vertical chassis walls 18,20,22 by snapping portions of the guide channel members into place within specially configured openings formed in the vertical chassis walls.

As shown on the representative center chassis wall 20 in FIG. 4, on each of the three vertical chassis walls 18,20,22 these openings include identically configured, horizontally elongated front and rear openings 88 and 90, and a rectangular opening 92 positioned between the openings 88,90 and offset somewhat toward the front opening 88.

Each of the front and rear openings 88,90 has a generally rectangular front portion 94; a generally rectangular, longitudinally intermediate portion 96 separated by an opposed, separated pair of upper and lower tabs 98,100 projecting vertically into the opening from opposite sides of its periphery; and a vertically narrowed rear end portion 102 centered between top and bottom rear edge sections 104,106 of the opening portion 96.

For purposes of discussion, the structure of the guide channel members 46b,46c shown in FIG. 4, and the manner in which they snap into the openings 88,90 and 92 in the center chassis wall 20, will now be described. It will be appreciated, however, that the other two guide channel members 46a,46d are identical to the members 46b,46c and snap into their associated openings in vertical chassis walls 18,22 in the same manner.

Still referring to FIG. 4, each of the guide channel members 46b,46c has an elongated rectangular base wall 108 having front and rear ends 110 and 112, an inner side 114, and an outer side 116. Projecting outwardly from the opposite side edges of the base wall 108 are a pair of relatively narrow rectangular side walls 118 and 120. For purposes later described, front end portions 118a,120a of the side walls 118,120 project forwardly beyond the front end 110 of the base wall 108 and are laterally outwardly bent. Rearwardly adjacent these outwardly bent side wall portions, rectangular notches 122,124 are respectively formed in the side walls 118,120.

As illustrated in FIG. 4, the guide channel members 46b,46c are in their horizontally disposed pre-installation positions in which the inner sides 114 of their base walls 108 respectively face the left and right sides of the vertical chassis wall 20, the guide channel members are vertically aligned with the wall openings 88,90 and 92, and the front ends of the guide channel members face leftwardly. In this position, the side wall 120 of the guide channel member 46b extends along the top edge of its base wall 108, and the side wall 118 of the guide channel member 46c extends along the top edge of its base wall 108.

From left to right along the lengths of the guide channel members 46b,46c four rearwardly opening mounting hook portions 126,128,130,132 project toward the chassis wall 20. As illustrated, on each of the guide channel members 46b,46c hook portion 126 is positioned adjacent the side wall 118 at a rectangular base wall opening 134 having a stabilizing tab 136 projecting from its rear edge toward the chassis wall 20; the hook portion 128 is positioned adjacent the side wall 120 at a rectangular base wall opening 138 having a stabilizing tab 140 projecting from its rear edge toward the chassis wall 20; the hook portion 130 is positioned adjacent the side wall 118 at a rectangular base wall opening 142 having a stabilizing tab 144 projecting from its rear edge toward the chassis wall 20; and the hook portion 132 is positioned adjacent the side wall 120 at a rectangular base wall opening 146 having a stabilizing tab 148 projecting from its rear edge toward the chassis wall 20.

A rectangular base wall opening 150 adjacent the side wall 120 is positioned longitudinally between the openings 138,142 and is offset somewhat toward the opening 138. A resilient locking tab 152, having a front end edge 154, is bent outwardly from the rear edge of base wall opening 150 toward the chassis wall 20 and is offset within opening 150 toward the side wall 120.

With the guide channel 46b in its pre-installation position shown in FIG. 4, it is pushed laterally inwardly against the chassis wall 20, as indicated by the arrows 154, to cause the hook portions 126,128 of the guide channel to respectively enter bottom and top parts of the portions 94,96 of the chassis wall opening 88; its hook portions 130,132 to respectively enter bottom and top parts of the portions 94,96 of the chassis wall opening 90; and deflect the locking tab 152 against a left side portion of the chassis wall 20 positioned slightly forwardly of the wall opening 92.

The guide channel member 46b is then pushed rearwardly along the chassis wall 20, as indicated by the arrow 156. This causes the hook portions 126 and 128, respectively, to forwardly receive the tab 100 and edge portion 104 of chassis wall opening 88; the hook portions 130 and 132, respectively, to forwardly receive the tab 100 and edge portion 104 of chassis wall opening 90; and the locking tab 152 to snap into place within an upper portion of the chassis wall opening 92 so that the rear end edge 154 of tab 152 faces a top portion of the front side edge 158 of opening 92, thereby latching guide channel member 46b in place on the left side of the chassis wall 20.

With the guide channel member 46b snapped into place in this manner, its stabilizing tabs 136 and 144 respectively engage the top end edges of chassis wall opening tabs 100, and its stabilizing tabs 140 and 148 respectively engage the top side edges of the chassis wall opening portions 102, to thereby inhibit vertical movement of the installed guide channel member 46b relative to the chassis wall 20.

The guide channel 46c is then snapped into place on the right side of the chassis wall 20 in the same manner. With the guide channel 46c in its pre-installation position shown in FIG. 4, it is pushed laterally inwardly against the chassis wall 20, as indicated by the arrows 160, to cause the hook portions 126,128 of the guide channel 46c to respectively enter top and bottom parts of the portions 94,96 of the chassis wall opening 88; its hook portions 130,132 to respectively enter top and bottom parts of the portions 94,96 of the chassis wall opening 90; and deflect the locking tab 152 against a right side portion of the chassis wall 20 positioned slightly forwardly of the wall opening 92.

The guide channel member 46c is then pushed rearwardly along the chassis wall 20, as indicated by the arrow 162. This causes the hook portions 126 and 128, respectively, to forwardly receive the tab 98 and edge portion 106 of chassis wall opening 88; the hook portions 130 and 132, respectively, to forwardly receive the tab 98 and edge portion 106 of chassis wall opening 90; and the locking tab 152 to snap into place within a lower portion of the chassis wall opening 92 so that the rear end edge 154 of tab 152 faces a bottom portion of the front side edge 158 of opening 92, thereby latching guide channel member 46c in place on the right side of the chassis wall 20.

With the guide channel member 46c snapped into place in this manner, its stabilizing tabs 136 and 144 respectively engage the bottom end edges of chassis wall opening tabs 98, and its stabilizing tabs 140 and 148 respectively engage the bottom side edges of the chassis wall opening portions 102, to thereby inhibit vertical movement of the installed guide channel member 46b relative to the chassis wall 20.

As previously mentioned, the guide channels 46a and 46d are respectively snapped into place on their associated chassis walls 18,22 in the same manner just described for the guide channels 46b and 46c. With the guide channels installed on the vertical chassis walls, and the retainer members 44 installed on the disk drives 12a,12b as previously described, the disk drives 12a,12b may be quickly and easily installed within their associated chassis bays 24,26 simply by rearwardly sliding the retainer members 44 of each disk drive into their associated guide channels to bring the disk drives to their operating positions shown in FIG. 2.

Referring now to FIGS. 5A and 5B, as either disk drive rearwardly approaches its operating position, as indicated by the arrow 164 in FIG. 5A, the outwardly bent side wall end portions 118a,120a of its associated guide channel pair engage the boss pairs 54,56 of its retainer member legs 50,52 and inwardly cams the legs as indicated by the arrows 166,168 in FIG. 5A. When the disk drive rearwardly reaches its operating position, the bosses 54,56 snap outwardly through the guide channel side wall notches 122,124 (see FIG. 5B) to releasably lock the disk drive against forward or rearward movement relative to the chassis.

The installed disk drive may be easily and quickly removed from the chassis simply by squeezing its retainer member leg pairs 50,52 together (as indicated by the arrows 166,168 in FIG. 5A), thereby pulling the bosses 54,56 out of their guide channel notches 122 and 124, and then pulling the disk drive forwardly out of its chassis bay.

The snap-lock mounting system of the present invention thus permits the disk drives 12a,12b to be quickly and easily installed within, and removed from, the chassis without the previous necessity of screwing a rail portion of the disk drive to the chassis, and later unscrewing the rail portion, and also advantageously permits the two disk drives to be mounted in the compact side-by-side relationship within the chassis as depicted in FIG. 2.

In addition to these advantages of the mounting system, the previously described snap-fit installation of the guide channels permits them to be quickly and easily installed within the chassis without the use of threaded fasteners. Moreover, according to another aspect of the present invention, the retainer member mounting screw head portions 74,78 (see FIGS. 3 and 5A) are diametrically sized so that as the retainer members 44 are rearwardly inserted into their associated guide channels 46 the peripheries of the screw heads 74,78 slidingly engage the side wall portions 118,120 of their associated guide channels. This feature of the mounting structure electrically grounds the installed disk drives to the chassis through the metal mounting screws 68 and 70.

The foregoing detailed description is to be clearly understood as being given by way of illustration and example only, the spirit and scope of the present invention being limited solely by the appended claims.

What is claimed is:

1. Apparatus for securing a side portion of a disk drive to a computer chassis wall, comprising:
   - an elongated guide channel member having an open side portion, a front end portion, and a generally U-shaped cross-section along its length, said guide channel member being mountable on said chassis wall with said open side portion of said guide channel member facing away from the wall;
   - retainer means supportable in said guide channel member, said retainer means being configured to be longitudinally inserted through the interior of said guide channel member and being securable to said side portion of a disk drive, said retainer means including an elongated retainer member having a front end portion and being rearwardly insertable into said guide channel member through said front end portion thereof; and
   - cooperating means, associated with said front end portions of said retainer member and said guide channel member, for releasably interlocking said retainer means and said guide channel member in response to insertion of said retainer means a predetermined longitudinal distance through the interior of said guide channel member,
   - said guide channel member having an elongated rectangular base wall positionable against said computer chassis wall, and a pair of opposite side walls projecting transversely outwardly from opposite side edges of said base wall, said side walls having forwardly and outwardly angled front end portions disposed forwardly adjacent a pair of notches formed in said side walls, and
   - said front end portion of said retainer member being bifurcated and defined by a pair of opposed, resiliently deflectable arms having front ends positioned forwardly of a pair of projecting bosses carried by said arms,
      - said bosses being positioned to be cammed inwardly toward one another by said front end portions of said side walls, and then snap outwardly into said side wall notches, as said bifurcated front end portion of said retainer member is moved rearwardly into said guide channel member,
      - said opposed arms being manually deflectable toward one another to inwardly remove said bosses from said notches to permit forward removal of said retainer member from said guide channel member by forwardly pulling on the deflected arms.

2. Apparatus for securing a side portion of a disk drive to a computer chassis wall, comprising:
   - an elongated guide channel member having an open side portion, and a generally U-shaped cross-section along its length, said guide channel member being mountable on said chassis wall with said open side portion of said guide channel member facing away from the wall;
   - retainer means supportable in said guide channel member, said retainer means being configured to be longitudinally inserted through the interior of said guide channel member and being securable to said side portion of a disk drive; and
   - cooperating means on said retainer means and said guide channel member for releasably interlocking said retainer means and said guide channel member in response to insertion of said retainer means a predetermined longitudinal distance through the interior of said guide channel member,
   - said computer chassis wall being formed from a metal material,
   - said guide channel member being formed from a metal material and having an elongated rectangular base wall positionable against said computer chassis wall, and a pair of opposite side walls projecting transversely outwardly from said base wall, and
   - said retainer means including an elongated plastic retainer member having a longitudinally spaced plurality of mounting openings extending transversely therethrough, and a plurality of metal fastening members extendable through said mounting openings and threadable into said side portion of said disk drive, said fastening members having cylindrical head portions diametrically sized to slidingly and inwardly engage said opposite side walls of said guide channel when said retainer member is operatively inserted into said guide channel member.

3. Apparatus for securing a side portion of a disk drive to a computer chassis wall having a spaced plurality of mounting openings therein, said mounting openings being bounded by peripheral wall portions, said apparatus comprising:
   - an elongated guide channel member having an open side portion, and a generally U-shaped cross-section along its length, said guide channel member being mountable on said chassis wall with said open side portion of said guide channel member facing away from the wall, said guide channel member having mounting means thereon operative to provide a snap-fit mounting engagement between said guide channel member and said peripheral wall portions of said spaced plurality of mounting openings in said computer chassis wall;

retainer means supportable in said guide channel member, said retainer means being configured to be longitudinally inserted through the interior of said guide channel member and being securable to said side portion of a disk drive; and cooperating means on said retainer means and said guide channel member for releasably interlocking said retainer means and said guide channel member in response to insertion of said retainer means a predetermined longitudinal distance through the interior of said guide channel member, said mounting means further including hook means for receiving at least one of said peripheral wall portions, and latch means receivable in one of said mounting openings for cooperating with a peripheral wall portion thereof to block longitudinal movement of said guide channel member relative to said computer chassis wall.

4. The apparatus of claim 3 wherein said mounting means further include:

stabilizing tab means for cooperating with a plurality of said peripheral wall portions to block lateral movement of said guide channel member relative to said computer chassis wall.

5. Apparatus for mounting a disk drive on first and second spaced apart, facing, parallel walls of a computer chassis, the disk drive having generally parallel opposite side portions, said apparatus comprising:

first and second elongated guide channel members having open side portions, and generally U-shaped cross-sections along their lengths;

first means for mounting said guide channel members on the facing surfaces of said first and second chassis walls in a parallel relationship in which said open side portions of the mounted first and second guide channel members face one another, said first means including:

spaced pluralities of mounting openings formed in said first and second chassis walls and being bounded by peripheral wall portions, and means formed on said guide channel members for providing a snap-fit mounting engagement between said guide channel members and said peripheral portions of the spaced pluralities of mounting openings on their associated chassis walls, said means formed on said guide channel members each including hook means for receiving at least one of said peripheral wall portions, and latch means receivable in one of said mounting openings for cooperating with a peripheral wall portion thereof to block longitudinal movement of each guide channel member relative to its associated chassis wall;

first and second elongated retainer members each configured to be telescopingly inserted lengthwise through the interior of one of said first and second guide channel members;

second means for securing said first and second retainer members, in a longitudinally parallel relationship, to opposite sides of a disk drive; and cooperating means on said retainer members and said guide channel members for releasably interlocking each guide channel member with its telescopingly received retainer member in response to insertion of the retainer member a predetermined longitudinal distance through the interior of the guide channel member.

6. The apparatus of claim 5 wherein said means formed on said guide channel members each further include:

stabilizing tab means for cooperating with a plurality of said peripheral wall portions to block lateral movement of each guide channel relative to its associated chassis wall.

7. Apparatus for mounting a disk drive on first and second spaced apart, facing, parallel walls of a computer chassis, the disk drive having generally parallel opposite side portions, said apparatus comprising:

first and second elongated guide channel members having open side portions, and generally U-shaped cross-sections along their lengths, each of said guide channel members further having a front end portion;

first means for mounting said guide channel members on the facing surfaces of said first and second chassis walls in a parallel relationship in which said open side portions of the mounted first and second guide channel members face one another;

first and second elongated retainer members each having a front end portion and being configured to be rearwardly inserted lengthwise through the interior of one of said first and second guide channel members through said front end portion thereof;

second means for securing said first and second retainer members, in a longitudinally parallel relationship, to said opposite sides of said disk drive; and cooperating means on said retainer members and said guide channel members for releasably interlocking each guide channel member with its telescopingly received retainer member in response to insertion of the retainer member a predetermined longitudinal distance through the interior of the guide channel member, wherein, for each guide channel member and its associated retainer member:

the guide channel member has an elongated rectangular base wall positionable against the chassis wall associated with the guide channel member, and a pair of opposite side walls projecting transversely outwardly from opposite side edges of said base wall, said side walls having forwardly and outwardly angled front end portions disposed forwardly adjacent a pair of notches formed in said side walls, and said front end portion of the retainer member is bifurcated and defined by a pair of opposed, resiliently deflectable arms having front ends positioned forwardly of a pair of projecting bosses carried by said arms, said bosses being positioned to be cammed inwardly toward one another by said front end portions of said side walls, and then snap outwardly into said ·side·wall notches, as said bifurcated front end portion of the retainer member is moved rearwardly into the guide channel member, said opposed arms being manually deflectable toward one another to inwardly remove said bosses from said notches to permit forward removal of the retainer member from the guide channel member by forwardly pulling on the deflected arms.

8. Apparatus for mounting a disk drive on first and second spaced apart, facing, parallel walls of a computer chassis, the disk drive having generally parallel opposite side portions, said apparatus comprising:

first and second elongated guide channels members having open side portions, and generally U-shaped cross-sections along their lengths;

first means for mounting said guide channel members on the facing surfaces of said first and second chassis walls in a parallel relationship in which said open side portions of the mounted first and second guide channel members face one another;

first and second elongated retainer members each configured to be telescopingly inserted lengthwise through the interior of one of said first and second guide channel members;

second means for securing said first and second retainer members, in a longitudinally parallel relationship, to said opposite sides of said disk drive; and cooperating means on said retainer members and said guide channel members for releasably interlocking each guide channel member with its telescopingly received retainer member in response to insertion of the retainer member a predetermined longitudinal distance through the interior of the guide channel member, said computer chassis being formed from a metal material, each of said guide channel members being formed from a metal material and having an elongated rectangular base wall positioned against its associated chassis wall, each of said retainer members being formed from a plastic material and having a longitudinally spaced plurality of mounting openings extending transversely therethrough, and said second means, for each of said retainer members, including a plurality of metal fastening members extendable through the mounting openings of the retainer member and threadable into side portions of a disk drive, said fastening members having cylindrical head portions diametrically sized to slidingly and inwardly engage the opposite side walls of one of said guide channel members.

9. Apparatus for mounting first and second disk drives in a side-by-side relationship respectively in adjacent first and second bays of a computer chassis, said first and second bays being partially bounded by first, second and third mutually spaced apart parallel chassis walls, said first bay being disposed between said first and second chassis walls, said second bay being disposed between said second and third chassis walls, and each of said first and second disk drives having generally parallel opposite sides, said apparatus comprising:

first, second, third and fourth elongated guide channel members each having a generally U-shaped cross-section along its length, and an open side portion;

first means for mounting said guide channel members on said chassis walls in a parallel, laterally aligned relationship in which:

said first and second guide channel members are respectively disposed on facing sides of said first and second chassis walls with said open side portions of said first and second guide channel members facing one another, and said third and fourth guide channel members are respectively disposed on facing sides of said second and third chassis walls with said open side portions of said third and fourth guide channel members facing one another;

first, second, third and fourth elongated retainer members configured to be respectively and telescopingly inserted lengthwise through the interiors of said first, second, third and fourth guide channel members;

second means for securing said first and second retainer members, in a longitudinally parallel relationship, to said opposite sides of said first disk drive, and for securing said third and fourth retainer members, in a longitudinally parallel relationship, to said opposite sides of said second disk drive; and cooperating means on each of said retainer members and its associated guide channel member for releasably interlocking the guide channel member with its telescopingly received retainer member in response to insertion of the retainer member a predetermined longitudinal distance through the interior of its associated guide channel member, said first means including spaced plurality of mounting openings formed in said first and second chassis walls and being bounded by peripheral wall portions, and means formed on said guide channel members for providing a snap-fit mounting engagement between said guide channel members and said peripheral portions of the spaced pluralities of mounting openings of their associated chassis walls, said means formed on said guide channel members each including hook means for receiving at least one of said peripheral wall portions, and latch means receivable in one of said mounting openings for cooperating with a peripheral wall portion thereof to block longitudinal movement of each guide channel member relative to its associated chassis wall.

10. The apparatus of claim 9 wherein said means formed on said guide channel members each further include:

stabilizing tab means for cooperating with a plurality of said peripheral wall portions to block lateral movement of each guide channel relative to its associated chassis wall.

11. Apparatus for mounting first and second disk drives in a side-by-side relationship respectively in adjacent first and second bays of a computer chassis, said first and second bays being partially bounded by first, second and third mutually spaced apart parallel chassis walls, said first bay being disposed between said first and second chassis walls, said second bay being disposed between said second and third chassis walls, and each of said first and second disk drives having generally parallel opposite sides, said apparatus comprising:

first, second, third and fourth elongated guide channel members each having a generally U-shaped cross-section along its length, and an open side portion;

first means for mounting said guide channel members on said chassis walls in a parallel, laterally aligned relationship in which:
said first and second guide channel members are respectively disposed on facing sides of said first and second chassis walls with said open side portions of said first and second guide channel members facing one another, and
said third and fourth guide channel members are respectively disposed on facing sides of said second and third chassis walls with said open side portions of said third and fourth guide channel members facing one another;

first, second, third and fourth elongated retainer members configured to be respectively and telescopingly inserted lengthwise through the interiors of said first, second, third and fourth guide channel members,
each of said guide channel members and said retainer members having a front portion, and each of said retainer members is rearwardly insertable through one of said guide channel members through said front end portion thereof;

second means for securing said first and second retainer members, in a longitudinally parallel relationship, to said opposite sides of said first disk drive, and for securing said third and fourth retainer members, in a longitudinally parallel relationship, to said opposite sides of said second disk drive; and cooperating means on each of said retainer members and its associated guide channel member for releasably interlocking the guide channel member with its telescopingly received retainer member in response to insertion of the retainer member a predetermined longitudinal distance through the interior of its associated guide channel member, wherein, for each guide channel member and its associated retainer member;
the guide channel member has an elongated rectangular base wall positionable against the chassis wall associated with the guide channel member,
and a pair of opposite side walls projecting transversely outwardly from opposite side edges of said base wall, said side walls having forwardly and outwardly angled front end portions disposed forwardly adjacent a pair of notches formed in said side walls, and said front end portion of the retainer member is bifurcated and defined by a pair of opposed, resiliently deflectable arms having front ends positioned forwardly of a pair of projecting bosses carried by said arms, said bosses being positioned to be cammed inwardly toward one another by said front end portions of said side walls, and then snap outwardly into said side wall notches, as said bifurcated front end portion of the retainer member is moved rearwardly into the guide channel member, said opposed arms being manually deflectable toward one another to inwardly remove said bosses form said notches to permit forward removal of the retainer member from the guide channel member for forwardly pulling on the deflected arms.

12. The apparatus of claim 11 wherein:
said computer chassis is formed from a metal material,
each of said guide channel members is formed from a metal material and has an elongated rectangular base wall positioned against its associated chassis wall,
each of said retainer members is formed from a plastic material and has a longitudinally spaced plurality of mounting openings extending transversely therethrough, and
said second means, for each of said retainer members, include a plurality of metal fastening members extendable through the mounting openings of the retainer member and threadable into one of said side portions of said disk drive, said fastening members having cylindrical head portions diametrically sized to slidingly and inwardly engage the opposite side walls of one of said guide channel members.

* * * * *